United States Patent
Wright et al.

(10) Patent No.: US 9,783,913 B2
(45) Date of Patent: Oct. 10, 2017

(54) APPARATUS AND METHOD FOR BULK VAPOUR PHASE CRYSTAL GROWTH

(71) Applicant: Kromek Limited, Sedgefield (GB)

(72) Inventors: Timothy Simon Wright, Durham (GB); Steven Colledge, Durham (GB); John Tomlinson Mullins, Durham (GB)

(73) Assignee: Kromek Limited, Sedgefield (GB)

( * ) Notice: Subject to any disclaimer, the term of this patent is extended or adjusted under 35 U.S.C. 154(b) by 262 days.

(21) Appl. No.: 14/407,243

(22) PCT Filed: Jun. 12, 2013

(86) PCT No.: PCT/GB2013/051541
§ 371 (c)(1),
(2) Date: Dec. 11, 2014

(87) PCT Pub. No.: WO2013/186556
PCT Pub. Date: Dec. 19, 2013

(65) Prior Publication Data
US 2015/0176152 A1 Jun. 25, 2015

(30) Foreign Application Priority Data
Jun. 14, 2012 (GB) .................................. 1210519.3

(51) Int. Cl.
*C30B 23/02* (2006.01)
*C30B 23/00* (2006.01)
(Continued)

(52) U.S. Cl.
CPC ............ *C30B 23/005* (2013.01); *C30B 29/48* (2013.01); *C30B 35/00* (2013.01); *F15D 1/025* (2013.01)

(58) Field of Classification Search
CPC ......... C30B 23/02; C30B 25/08; C30B 25/16; C30B 25/10
See application file for complete search history.

(56) References Cited

U.S. PATENT DOCUMENTS

| 3,051,558 A | 8/1962 | Jost |
| 4,993,360 A | 2/1991 | Nakamura |
| (Continued) | | |

FOREIGN PATENT DOCUMENTS

| EP | 1019568 A1 | 7/2000 |
| GB | 2423307 A | 8/2006 |
| (Continued) | | |

OTHER PUBLICATIONS

Schmitt, Christian, "International Search Report" for PCT/GB2013/051541, dated Aug. 14, 2013, 4 pages.

*Primary Examiner* — Robert M Kunemund
(74) *Attorney, Agent, or Firm* — Winstead PC

(57) ABSTRACT

A vapor conduit for use in an apparatus for bulk vapor phase crystal growth, an apparatus for bulk vapor phase crystal growth, and a process for bulk vapor phase crystal growth are described. The vapor conduit is a flow conduit defining a passage means adapted for transport of vapor from a source volume to a growth volume, wherein a flow restrictor is provided in the passage means between the source volume and the growth volume and wherein the flow conduit further comprises a flow director structured to direct vapor flow downstream of the flow restrictor away from a longitudinal center line of the conduit and for example towards an edge of the conduit.

23 Claims, 1 Drawing Sheet

(51) Int. Cl.
  *C30B 35/00*   (2006.01)
  *C30B 29/48*   (2006.01)
  *F15D 1/02*    (2006.01)

(56) References Cited

U.S. PATENT DOCUMENTS

| | | |
|---|---|---|
| 5,106,453 A | 4/1992 | Benko et al. |
| 2007/0108450 A1 | 5/2007 | O'Loughlin et al. |
| 2010/0133550 A1 | 6/2010 | Zhang et al. |

FOREIGN PATENT DOCUMENTS

| | | |
|---|---|---|
| JP | H04356915 A | 12/1992 |
| JP | 2001514149 A | 9/2001 |
| JP | 2010084190 A | 4/2010 |
| WO | WO-99/10571 A1 | 3/1999 |
| WO | WO-9910571 A1 | 3/1999 |
| WO | WO-2010/045567 A1 | 4/2010 |
| WO | WO-2010/052676 A2 | 5/2010 |
| WO | WO-2013151045 A1 | 10/2013 | ness.
APPARATUS AND METHOD FOR BULK VAPOUR PHASE CRYSTAL GROWTH

The present invention relates to an apparatus and method for vapour phase crystal growth of single crystal materials, and in particular of single crystal semi-conductor materials for high-energy physics applications and to a vapour phase conduit for use in such an apparatus and for implementation of such a method.

Single crystal materials have a number of important applications. For example, bulk cadmium telluride (CdTe) and cadmium zinc telluride (CZT) semiconductors are useful as x-ray and gamma-ray detectors which have application in security screening, medical imaging and space exploration amongst other things.

For many applications, it is desired to have single crystals of large size and thickness which can be formed rapidly with optimum uniformity and minimum impurities.

Traditionally, single crystals have been formed using direct solidification techniques, such as by the Bridgman, travelling heater (THM), gradient freeze (GF) or other liquid phase or self-seeding vapour phase crystal growth methods in which the crystals are grown from the melt. With these conventional methods, it has been difficult to form high quality crystals consistently, or to form single crystals having a diameter greater than 25 mm or 50 mm. In particular, with these known methods of crystal formation, dislocations, sub-grain boundaries and twins form easily. For high pressure Bridgman methods, there is also the potential problem of pipe formation. These problems are particular problems when forming CdTe crystals. The inclusion of zinc to make CZT reduces these problems to some extent as the zinc strengthens the lattice, however zinc segregation at the solidification interface may result in graded axial compositional profiles. However, higher temperatures are required for CZT growth, and this is undesirable. Also, the process tends to form precipitates and inclusions due to the excess tellurium in the melt. Tellurium inclusions can be tens of microns in size and this may be significant for detector applications. Further, there will be a dislocation cloud associated with each inclusion which will affect the performance of detectors formed from the crystal.

European Patent No EP1019568 discloses a method of forming crystals using a physical vapour phase technique. This method has become known as Multi-Tube Physical Vapour Phase Transport (MTPVT). According to this method, a growth zone is defined for example in that a sink or seed crystal of the material to be grown is provided. Vapour phase material is provided to the growth zone, causing nucleation and subsequent deposition of the material to grow the crystal at the growth zone and for example onto the sink or seed crystal.

In the example apparatus described in EP1019568 a growth zone of a growth tube is connected to one or more source reservoirs in one or more source tubes, containing the required elements or compounds, via a flow restrictor incorporated into a demountable manifold, referred to as the crossmember. This enables transport of vapour from the source reservoir(s) to the growth zone. Crystal growth takes place, optionally on a suitable sink or seed crystal, above a pedestal located inside the growth tube. In use, the source reservoir(s) are heated to produce the vapour form of their respective contents which is transported via the crossmember to the growth zone.

During growth, the temperatures in the source and growth zones are controllable independently, the zones being thermally isolated. The source zone can thus be maintained at an appropriate evaporation temperature and the growth zone at an appropriate growth temperature. This is achieved in part in that the flow path from source tube to growth tube via a crossmember enables any radiative coupling of source zone and growth zone to be restricted. Additionally, flow restrictors are required between the source and growth zones to allow the mass transport to be controlled without requiring an uncontrollably small source—growth temperature difference.

A flow restrictor may conveniently be located in the flow path between a source zone and a growth zone, typically provided for example at least in a crossmember in the flow path between a source tube and a growth tube. Example flow restrictors described in the prior art above include capillary transport tubes and other similar means which act to provide an aperture of substantially reduced cross-section to achieve the required control of mass transport between a source zone and a growth zone.

In a typical prior art case, a flow restrictor comprises a formation within and partially closing the conduit defining a flow path between a source zone and a growth zone with an apertured portion of substantially reduced cross-section located generally on a longitudinal centre line of the conduit. For example a formation with an apertured portion of substantially reduced cross-section is disposed such that the apertured portion is located axially in cylindrical or polygonal tubular conduit. Such an apertured portion may for example comprise the bore of a capillary transport tube. In the prior art document EP1019568 for example, a flow restrictor comprising a capillary transport tube defines a single such aperture lying generally axially within the crossmember tube between each source zone and growth zone to achieve the required control of mass transport through the crossmember between the source zone and the growth zone.

In the prior art, it has been found that a flow restrictor may produce an undesirable degree of directionality and localised concentration in the downstream flow of vapour to the growth zone. This can tend to direct growth, and in particular defect growth, preferentially in an undesirable manner to a particular area of the sink crystal. An aperture generally on a longitudinal centre line of a conduit defining a flow path between a source zone and a growth zone can tend to direct growth, and in particular defect growth, preferentially in an undesirable manner to a corresponding central zone of the growing crystal where defects are likely to be particularly undesirable. The invention seeks to mitigate this effect.

In its broadest aspect there is provided according to the present invention a vapour conduit for use in an apparatus for bulk vapour phase crystal growth comprising:

a flow conduit defining a passage means adapted for transport of vapour from a source volume to a growth volume, wherein a flow restrictor is provided in the passage means between the source volume and the growth volume and wherein the flow conduit further comprises a flow director structured to direct vapour flow downstream of the flow restrictor away from a longitudinal centre line of the conduit and for example towards an edge of the conduit.

As is familiar from the prior art such as that described in EP1019568 the vapour conduit is provided for use in an apparatus for bulk vapour phase crystal growth comprising a source volume that is thermally decoupled from a growth volume, and provides in use a passage means adapted for transport of vapour from the source volume to the growth volume. The source volume is thermally decoupled from the growth volume for example in that the flow path from source volume to growth volume via any flow passages therebetween enables any radiative coupling of source zone and growth zone to be restricted, for example in that it includes one or more deviations from a direct line of sight path as described in EP1019568. A source zone in the source volume can thus be maintained at an appropriate evaporation temperature and a growth zone in the growth volume at an appropriate growth temperature as above described. At least one flow restrictor is provided in the passage means between the source volume and the growth volume to allow the mass transport to be controlled without requiring an uncontrollably small source—growth temperature difference.

Example flow restrictors in accordance with the invention may be as described in the prior art. In a typical such case, a flow restrictor comprises a formation within and partially closing the flow path between a source zone and a growth zone. For example a flow restrictor comprises a formation within and partially closing the flow passage means between the source volume and the growth volume. Thus, in a flow direction, a relatively large cross-sectional area passage means on a source volume side narrows to a relatively restricted cross-sectional area at the flow restrictor and then opens to a relatively large cross-sectional area passage means on a growth volume side.

A flow restrictor may include for example any formations which act to provide an aperture of substantially reduced cross-section within a flow passage means to achieve the required control of mass transport between the source zone and the growth zone, and may for example comprise capillary transport tubes. Typically, such a flow restrictor in the prior art defines a single such aperture for example lying generally centrally and for example axially in the passage means. Such a single, central flow restrictor may produce a highly directional downstream flow which tends to produce concentrated growth, and defectivity, towards the central portion of the growing crystal. This is a highly undesirable location.

The invention is characterised by the additional provision of at least one flow director structured to direct vapour flow downstream of the flow restrictor away from a longitudinal centre line of the conduit and for example towards an edge of the conduit. Thus, in use, the flow director is structured to direct vapour flow in such manner as to produce an effect on bulk vapour flow in the growth zone which is such as to tend to produce peak bulk flow, and hence peak defect formation, away from the centre of the growing crystal in the growth zone, and for example to tend to produce peak bulk flow, and hence peak defect formation, towards one or more edges of the growing crystal in the growth zone.

A prior art flow restrictor defines a formation that tends to occlude the flow passage of a conduit between a source zone and a growth zone and for example provides a single aperture of substantially reduced cross-section located generally on a longitudinal centre line of the conduit and tends to direct downstream flow in a longitudinal direction. For example a formation with an apertured portion of substantially reduced cross-section is disposed such that the apertured portion is located axially in cylindrical or polygonal tubular conduit and tends to direct downstream flow in an axial direction. Such an apertured portion may for example comprise the bore of a capillary transport tube. Such a structure may be such that peak bulk flow distribution downstream, and hence peak bulk flow at the growth front, is generally towards the centre, with the possible undesirable effects considered above.

The invention envisages that a flow director is structured to produce peak vapour flow downstream of the flow restrictor away from a longitudinal centre line of the conduit. This may be embodied in a number of ways, subject to the general principle that in use peak bulk flow distribution downstream, and hence peak bulk flow at the growth front, is generally away from the centre, and for example towards the edge, mitigating the possible undesirable effects considered above.

For example, a flow director may comprise a formation located within the flow path of the flow conduit defining the passage means adapted for transport of vapour from a source volume to a growth volume to act downstream of flow restrictor, being structured and/or positioned in the flow path such as to produce a modified downstream vapour flow so modified that peak vapour flow is directed away from a longitudinal centre line of the conduit. The flow director formation may for example be structured to tend to guide or direct vapour flow away from a longitudinal centre line of the conduit and/or to restrict vapour flow along a longitudinal centre line of the conduit.

For example, a flow director formation may comprise an apertured formation structured to direct vapour flow downstream of the flow restrictor in a direction away from and at angle to a longitudinal direction such as an axial direction. Such a flow director could itself be disposed on a longitudinal centre line and still achieve the desired asymmetry of peak vapour flow at the growth front. Additionally or alternatively a flow director may comprise an apertured formation located off-centre and for example off-axis within the conduit. Such a flow director could itself be structured to produce longitudinal downstream flow and still achieve the desired asymmetry of peak vapour flow at the growth front.

In a possible embodiment, the flow director of the invention may be integrally formed with the flow restrictor. In a particular case the flow director of the invention may comprise a suitably modified flow restrictor.

In such a case the flow restrictor may comprise an apertured formation structured to direct vapour flow downstream in a direction away from and at angle to a longitudinal direction such as an axial direction and/or located off-centre and for example off-axis within the conduit.

For example a flow restrictor may comprise a capillary transport tube directed away from a longitudinal direction to direct vapour flow downstream of the flow restrictor in a direction away from and at angle to a longitudinal direction and/or located off the longitudinal centre within the conduit.

In an alternative embodiment, the flow director of the invention may be a discrete formation downstream of the flow restrictor.

In such a case the flow director may comprise a further apertured formation downstream of the at least one flow restrictor (that is, on a growth volume side of the at least one flow restrictor) and structured to direct vapour flow in a direction away from and at angle to a longitudinal direction such as an axial direction and/or located off-centre and for example off-axis within the conduit.

In a preferred embodiment a flow director comprises a diffuser downstream of the at least one flow restrictor in the passage means (that is, on a growth volume side of the at least one flow restrictor).

In a typical embodiment, a diffuser in accordance with this embodiment of the invention comprises a planar formation extending across the cross-sectional area of the passage means so as to substantially occlude the passage means, and provided with one or more apertured portions. A diffuser is for example a planar formation patterned with an array of apertures in the form of circular or other geometric shapes, annular structures or annular segments or the like.

The diffuser is disposed downstream of at least one flow restrictor, which may be of conventional form such as defines a formation that tends to occlude the flow passage of a conduit between a source zone and a growth zone and provides a single aperture of substantially reduced cross-section that is located generally on a longitudinal centre line of the conduit and tends to direct downstream flow in a longitudinal direction. For example a formation with an apertured portion of substantially reduced cross-section is disposed such that the apertured portion is located axially in cylindrical or polygonal tubular conduit and tends to direct downstream flow in an axial direction. Such an apertured portion may for example comprise the bore of a capillary transport tube.

As noted above, it has been found that a centrally disposed flow restrictor may produce an undesirable degree of directionality and localised concentration in the downstream flow of vapour to the growth zone. This can tend to direct growth, and in particular defect growth, preferentially in an undesirable manner to a particular area of the sink crystal.

Although this embodiment of the invention is not limited by any particular theory of operation, it would seem that the provision of a suitably patterned diffuser in accordance with the principles of the invention may be capable of mitigating this effect in two ways. First, the diffusing action may simply act to reduce the directionality and localised concentration of the flow downstream of the flow restrictor. Second, it has additionally been found that by appropriate selection of shape and/or pattern of the aperture and/or array of apertures within the diffuser it may be possible to introduce a particular desired directionality to direct the growth, and in particular any defectivity, preferentially to one area of the grown material on the sink crystal.

Thus, the diffuser in accordance with this aspect of the invention, suitably patterned for example with off-centre aperture(s), acts both as a diffuser as such and as a flow director structured to direct bulk vapour flow away from a longitudinal centre line of the conduit.

A diffuser preferably has such shaped and/or patterned array of apertures. Various arrangements may be suitable to produce such a desired directionality. An array of apertures may have a symmetrical or asymmetrical arrangement. The apertured portions may collectively comprise only a minor part of the overall cross-sectional area of the passage means, and for example less than 10%. Alternatively, the apertured portions may comprise a major part of the overall cross-sectional area of the passage means.

In a possible embodiment for use in conjunction with such a flow restrictor, a diffuser in accordance with the invention is provided with one or more apertures which are not aligned in a longitudinal direction with the corresponding aperture or apertures defined by the flow restrictor. For example, in the case where the flow restrictor defines an aperture generally in the centre of the flow passage, a diffuser comprises a planar formation with one or more apertures provided otherwise than at the centre of the flow passage and with no such aperture(s) aligned in a longitudinal direction with the corresponding aperture(s) defined by the flow restrictor.

A vapour conduit in accordance with the first aspect of the invention comprises a flow conduit defining a passage means adapted for transport of vapour from a source volume to a growth volume. The geometry of the flow conduit is not specifically pertinent to the invention, but suitable flow conduits may include tubes open at either end, for example including cylindrical tubes, polygonal walled tubes and the like. Such flow conduit tubes will be familiar in the art.

A vapour conduit in accordance with the first aspect of the invention may be suitable for use in an apparatus for bulk vapour phase crystal growth such as is described in the prior art, where it is known for example to provide at least one source volume and at least one growth volume with at least one flow passage therebetween, and optionally multiple source volumes for a common growth volume and/or multiple source volumes and multiple growth volumes with suitable arrangements of common or separate flow passages between them. The principles of the invention apply to all such apparatus where one or more flow restrictors are provided in a flow path between a source volume and a growth volume, and where one or more diffusers in accordance with the invention may be provided downstream of such flow restrictor(s).

In a more complete aspect there is provided according to the present invention an apparatus for bulk vapour phase crystal growth comprising:

a fluidly continuous envelope comprising at least one source volume, at least one growth volume, and at least one flow conduit between the source volume and the growth volume comprising a vapour conduit as above described. The flow conduit defines a passage means adapted for transport of vapour from the source volume to the growth volume, at least one flow restrictor is provided in the passage means between the source volume and the growth volume, and at least one diffuser is provided downstream of the flow restrictor(s).

The apparatus in the more complete aspect thus defines, and the vapour conduit comprises a part of in use, a fluidly continuous envelope volume including a flow restrictor between each source volume and an associated growth volume. The apparatus is thus in general a physical vapour transport crystal growth system such as the Multi-Tube Physical Vapour Phase Transport (MTPVT) described in European Patent No EP1019568. The apparatus forms an envelope assembly including at least one source volume and at least one growth volume which envelope assembly is substantially enclosed and can be evacuated to a relatively high vacuum for use. Each source volume includes at least one source zone in which a source may be provided for one or more of the required elements or compounds for the growth of the crystal in a growth zone of the growth volume. A growth volume includes at least one growth zone in which the crystal may be grown during a growth phase in use. A source zone is typically at a first end of the envelope volume, the growth zone is at a second end remote therefrom, and the remainder of the source volume, the remainder of the growth volume, and the flow conduit between them together define a flow passage between the source zone and the growth zone for the flow of vapour from the source zone to the growth zone during the growth phase in accordance with the general principles set out for example in EP1019568.

Flow restrictors are provided in the flow conduit such as to lie in the flow path between the source zone and the growth zone to allow the mass transport between the source zone and the growth zone to be controlled without requiring an uncontrollably small source—growth temperature difference. As in the prior art, a flow restrictor comprising an apertured formation, and for example comprising a capillary transport tube, defines a single aperture constituting a substantial reduction in cross-section relative to the cross-section of the flow conduit lying generally axially within the flow conduit so as to achieve the required control of mass transport through the flow conduit between the source zone and the growth zone.

The fluidly continuous envelope may comprise an integral structure or may comprise a plurality of modules, for example discrete demountable modules. A suitable modular construction might for example comprise a source module defining a source volume, a growth module defining a growth volume, and a transport module serving as the flow conduit and defining in use a flow path between the source volume and the growth volume. In many instances it may be convenient that the modules collectively defining the fluidly continuous envelope volume are discrete and demountable formations enabling assembly and disassembly of the fluidly continuous envelope prior to use for example for loading with source materials. Such modules are preferably adapted to be assembled in substantially leak tight manner to provide a substantially leak tight envelope volume when so assembled.

A module or envelope conveniently comprises a vessel wall defining an internal volume and is for example tubular and elongate with a continuous tubular wall structure extending between spaced first and second ends whereat fluid communication is effected with adjacent modules and/or where a closure or partial closure is provided. In the case of an embodiment comprising demountable modules, such ends as are to be mounted to adjacent modules are provided with mounting joints preferably adapted to be assembled to be substantially leak tight.

A module or envelope making up the apparatus of the invention is suitably constructed of any material which is adapted for use at the temperatures envisaged for crystal growth, for example is constructed of low, ambient or high temperature resistant material. Suitable materials are known in the art and preference is given to metal oxides, and in particular quartz, refractory oxides and graphite having the required mechanical strength and integrity, for example being reinforced with a suitable material providing mechanical strength and integrity. These materials are also preferred for reason of their high purity with low risk of contamination of crystal.

In a possible embodiment, a module or envelope may comprise a glass tube, for example of high purity quartz glass, adapted for connection to adjacent modules where applicable using mutually co-operating tapered ground glass seals.

A tube serving as a conduit in an apparatus accordance with the invention may have curved and for example circular or polygonal walls. A tube serving as a conduit in an apparatus accordance with the invention may have constant or varying cross-section. A tube serving as a conduit in an apparatus accordance with the invention may integrally form a single flow passage and/or a plurality of flow passages for example branched flow passages and/or may be a part of a modular flow passage conduit structure.

Preferably the apparatus comprises a sealed or sealable structure or envelope including zones and passages as hereinbefore defined. The apparatus is suitably operated at reduced pressure and is encased in a vacuum jacket or the like.

Each source zone and growth zone may be provided with means for independent temperature control within the zone, the zones being thermally decoupled, for example in the manner described in EP1019568, to facilitate evaporation at the source zone, vapour phase transport to the growth zone, and crystal growth at the growth zone on a growth substrate for example on a seed crystal or a partly grown crystal of target material.

The apparatus of the invention may be used for any bulk vapour transport techniques as hereinbefore defined. It is a particular advantage that the apparatus is adapted for growth of crystals from polycrystalline binary, ternary or other multinary compounds. It is a further advantage that the apparatus of the invention is suited for use with growth of crystal from binary, ternary or other multinary compounds requiring stoichiometry control to compensate for a degree of non-stoichiometry in vapour composition of the desired crystal.

The source and growth zones are adapted to comprise source material and seed crystal as known in the art, for example in the form of one or more reservoirs of source material and a crystal of seed material.

Preferably the one or more reservoirs of source material comprise material in solid phase supported on a glass or other suitable surface or pedestal adapted to the processing conditions to be employed, allowing convenient and efficient vaporisation.

A seed crystal substrate can be formed from various materials. However, preferred materials for these seed substrates are silicon and gallium arsenide. An advantage of forming crystals on a silicon and gallium arsenide substrate is that these substrates have good mechanical strength and commercially available at an acceptable price.

This both helps ensure that the crystal material is consistently formed on the substrate, which may be more difficult with a less robust substrate, and also helps maintain the integrity of the formed material in subsequent processing, use and transportation.

Such a seed substrate may be of any size required, depending upon the required size of the crystal material. However, it is preferred that the substrate has a diameter greater than 25 mm, preferably greater than 50 mm, and most preferably at least 150 mm.

The crystal materials formed may include group II-VI semiconductors such as semiconductors of the cadmium telluride type (including for example cadmium telluride, cadmium zinc telluride (CZT), cadmium magnesium telluride (CMT) and alloys thereof), and for example comprise crystalline $Cd_{1-(a+b)}Mn_aZn_b$Te where a+b<1 and a and/or b may be zero.

The crystal materials are preferably formed as a bulk crystal, and for example as a bulk single crystal (where bulk crystal in this context indicates a thickness of at least 500 μm, and preferably of at least 1 mm). It is an advantage of the apparatus and method of the invention that it facilitates the preparation of high quality large size bulk crystal material products.

Separate control of the source temperature ($T_{source}$) and the substrate temperature ($T_{sub}$) is provided. A variation in the source and/or substrate temperature will result in a change of the temperature differential ($\Delta T$). By increasing the temperature differential, for example by increasing the source temperature, the overall growth rate may be increased.

By way of example, in the case of cadmium telluride, typically, the minimum source temperature will be around 450° C. to ensure the sublimation of the material. At temperatures lower than this, no substantial sublimation will occur. Similarly by example, for cadmium telluride the minimum substrate temperature is around 200° C. It will be appreciated that the growth and sublimation temperatures are dependent on the material being deposited. For example, the growth temperature for mercury iodide is around 100 to 150° C. and the sublimation temperature is around 200 to 300° C. Minimum and optimum source and substrate temperatures will vary correspondingly.

The fluidly continuous envelope as hereinbefore defined comprises at least one flow passage for vapour transport from a source zone to a growth zone in use, in particular preferably for use in manner embodying the principles of physical vapour phase transport described in EP1019568.

In particular, in accordance with these principles, the or each flow passage so defined deviates from a straight line at at least two points between source and growth zones, for example deviating from a straight line at or about a junction between the source volume and the flow conduit and at or about a junction between the flow conduit and the growth volume. This deviation helps to keep source and growth zones thermally isolated. This thermal isolation assists in ensuring and controlling the temperature differential between the source and growth zones, and therefore assists with the control of crystal growth.

Preferably the deviation from a straight line is at least 5 degrees, more preferably at least 45 degrees, and in many instances conveniently approaches 90 degrees, whereby the source volume, flow conduit and growth volume collectively define a U-shaped flow passage for vapour transport from a source zone to a growth zone in use.

Thus, in the preferred case, the envelope volume defines a generally U-shaped tubular envelope having a source limb, a growth limb, and a crossmember connecting the first and second limbs, the source limb being arranged to contain a source material, and the growth limb being arranged to support growth. A source flow restrictor as above described is provided in the flow path between the first and second limbs, for example in the cross member, and a flow director such as a diffuser as above described is provided integrally with or downstream of the flow restrictor, for example in the cross member and/or in the growth limb. The invention admits arrangements with plural such first or second limbs In a particularly preferred case, a source limb and a growth limb are disposed substantially parallel to each other and for example upright, with a cross member extending between them.

In a preferred case the source zone and growth zone are located respectively at ends of the source zone and growth zone furthest from each other and from the manifold module. For example, the source zone and growth zone are located respectively at lower ends of the source volume and growth volume with the remainder of the source volume and growth volume constituting flow passages extending substantially upwardly therefrom and joined fluidly by a cross member thereby providing for optimal vapour transport from the source zone to the growth zone.

A flow restrictor and flow director as above described are conveniently provided in the cross member. Additionally or alternatively a flow director may be provided in the growth limb.

An envelope volume as hereinbefore defined may comprise a plurality of source zones, for example each associated with a passage for vapour transport, which passages may converge or otherwise, thereby having a common or separate passageways proximal to a single growth zone. By this means, a plurality of source zones may be located about a common growth zone, for example radially or extending outwardly to one side thereof. For example, where two separate sources are required for formation of a single crystal in a common growth zone, the envelope volume will comprise a source volume including the first source material connected to the growth volume via a first flow conduit, and a further source volume including the second source material connected to the growth volume via a second flow conduit. A common manifold may define such plural flow conduits.

Alternatively a plurality of source zones may be associated with a plurality of separate growth zones. The inclusion of multiple growth zones permits the simultaneous growth of multiple crystals of the same or different composition.

Where multiple source volumes are provided, any or all of these may be provided with independent flow restrictors.

Such a plurality of source zones may be independently activated by means of independent temperature control means associated with each source zone, whereby vapour may be generated sequentially or simultaneously from respective source zones with the required temperature differentials. Additionally or alternatively the temperature profile may be varied by appropriate configuration such that the plural sources are positioned within a common temperature profile in use with respect to each other and to the growth zone to provide the required temperature differentials.

In a preferred embodiment a plurality of source zones may be adapted to contain a combination of different elemental or compound source material providing each element or compound respectively of a binary, ternary or other multinary compound, for example in the manner of the Multi-Tube Physical Vapour Phase Transport (MTPVT) described in European Patent No EP1019568.

The source and growth zones are conveniently adapted to comprise source material and seed crystal as known in the art, for example in the form of one or more reservoirs of source material and a crystal of seed material. Preferably the one or more reservoirs of source material comprise material in solid phase supported on a glass or other suitable surface or pedestal adapted to the processing conditions to be employed, allowing convenient and efficient vaporisation.

Where multiple sources are provided, the composition of the crystal material deposited may be changed during the growth. This control may be achieved for example by control of the temperature gradient between the source and growth zones and/or by control of the temperature of the source tube(s) which will affect the various vapour pressures. In one example, the crystal material is initially deposited at a low deposition rate, with the deposition being controlled to increase the rate of deposition.

In a further aspect of the invention there is provided a process for bulk vapour phase crystal growth comprising: providing at least one reservoir of source material and at least one seed crystal, each associated with independent temperature control means; and transporting vapour phase material between source and sink or seed via a flow conduit that defines a passage means with at least one flow restrictor provided in the passage means between the source volume and the growth volume, and at and wherein the flow conduit further comprises a flow director structured to direct vapour flow downstream of the flow restrictor away from a longitudinal centre line of the conduit and for example towards an edge of the conduit The process is thus a process for bulk vapour phase crystal growth comprising the use of a vapour conduit and more completely an apparatus for bulk vapour phase crystal growth in accordance with the aspects of the invention as above described, and preferred features of the process will be understood by analogy.

The process may be operated at reduced, ambient or elevated temperature. The process is typically operated at reduced pressure, for example in the range up to 1 bar, preferably 0.01 to 100 mbar reduced pressure. The process preferably comprises in an initial step evacuating the envelope volume to such a reduced pressure.

The process may be started up by known means to establish a sufficient vapour pressure above source material to initiate growth.

Subject to the use of one or more diffusers in accordance with the principles of the invention, the process is thus a process for bulk vapour phase crystal growth such as the Multi-Tube Physical Vapour Phase Transport (MTPVT) process described in EP1019568. Other preferred features of the process will be inferred by reference to that document.

The invention will now be described by way of example only with reference to FIGS. 1 and 2 of the accompanying drawings in which.

Figure 1:
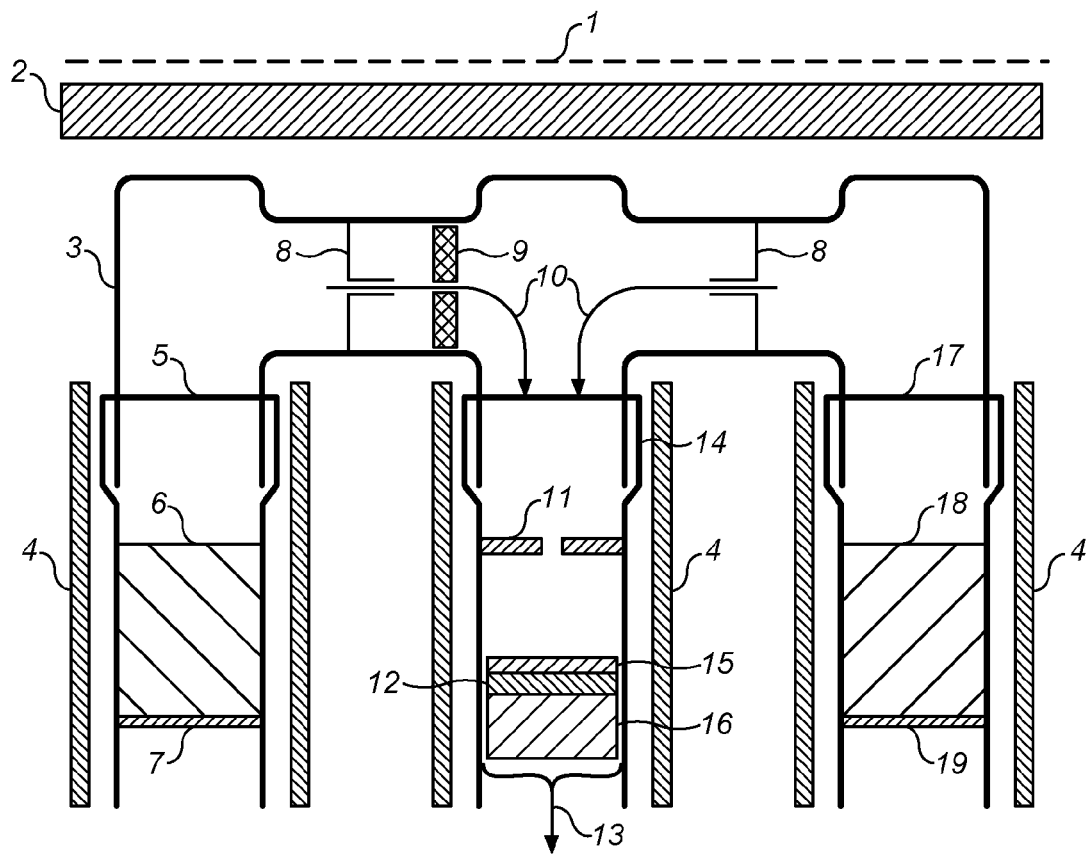
FIG. 1 is an example of an embodiment of an apparatus for bulk vapour phase crystal growth.

An example apparatus for the formation of bulk single crystal materials is shown in FIG. 1. The apparatus is for example one embodying the principles of the Multi-Tube Physical Vapour Phase Transport process disclosed in EP1019568.

The example apparatus comprises a tubular envelope made up of a pair of vertically disposed source tubes (5, 17) each defining a source zone at its lower end, a vertically disposed growth tube (14) defining a growth zone at its lower end, and a crossmember tube (3). A first source (6) is provided in the first source zone on a suitable support (7) and a second source (18) in the second source zone on a suitable support (19). The embodiment is thus a plural source, single sink MTPVT apparatus with a common crossmember, but this is merely an example of a suitable arrangement of source/growth/crossmember.

For example, the respective source materials may be a source of cadmium telluride and a source of zinc telluride which forms a cadmium telluride or cadmium zinc telluride crystal on a cadmium telluride seed crystal. However, many other crystals may be grown on suitable seed crystals. In the embodiment, a first source of cadmium telluride (6) and a second source of zinc telluride (18) are provided to grow cadmium zinc telluride crystal (15) on a cadmium telluride seed crystal (16).

Heaters in the form of separate and independently controllable vertical tubular furnaces (4), each for example defining plural heating zones, are provided for the source and the growth zones respectively. The horizontal crossmember tube (3) may optionally be heated by a crossmember heater (2). Alternatively, a single multi-zone heater could be provided arranged to heat a heated zone of the tubular furnaces to give a predetermined temperature profile along the length of the heated zone.

The source tubes (5, 17), growth tube (14) and crossmember (3) in the embodiment are fabricated from quartz and the system in the example is demountable with ground glass joints between the crossmember and the two vertical tubes allowing removal of grown crystals and replenishment of source material. Alternatively the envelope could be integrally formed.

The whole assembly forms a quartz envelope volume defining a flow passage between each source zone and the growth zone. A flow restrictor in the example being a capillary (8) is provided in each passage so defined, in the flow path (10) between a respective source zone and the growth zone, to decouple the source temperature from the growth temperature.

A vacuum jacket (shown schematically only by the broken line 1 which separates ambient air above and vacuum below) surrounds the entire system.

Each flow passage so defined comprises two separate points of deviation at an angle of 90° respectively as the flow path passes from vertical source tube (5, 17) to horizontal crossmember (3) and from horizontal crossmember to vertical growth tube (14). As will be familiar this decouples the source and growth tubes thermally and may provide sites for additional functionality, for example for in-situ monitoring via windows allowing optical access to source and growth zone, temperature measurement at the surface of growing crystal by a pyrometer or other optical diagnostic apparatus etc.

Growth takes place on a substrate in the growth zone. In a preferred case, growth of the crystal (15) takes place on a seed crystal (12) held in the growth zone on a platform (16). For some applications, such as detector applications, a bulk crystal material, for example of cadmium telluride, cadmium zinc telluride (CZT), cadmium magnesium telluride (CMT) and alloys thereof, may be required having a large area. However, in the case of such materials, seed crystals of sufficiently large size may not be available, or may only be available at high cost. In such a case, it may be desirable to form the crystal material on a seed crystal of a different material, for example on a silicon or gallium arsenide seed crystal, that it more easily or cheaply available. This can be achieved by the use of a seed crystal comprises a crystal of a material different from the material to be deposited, the seed crystal being provided with an intermediate layer or region onto which a bulk crystal material is deposited using the apparatus of the present invention.

The apparatus in the invention is characterised by the provision, downstream of the flow restrictors within the source zone to growth zone path, of diffusers which serve to diffuse the highly directional flow produced by the flow restrictors.

Figure 2:
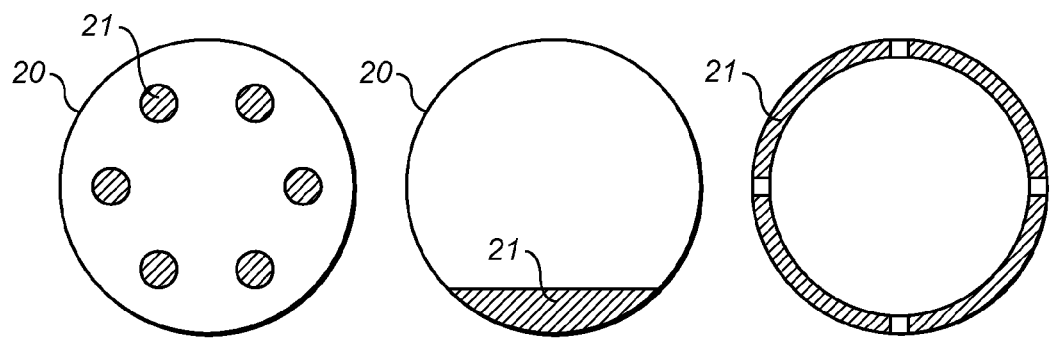
FIG. 2 illustrates certain example designs of diffuser.

Example diffusers are shown in FIG. 2. In the embodiment, a diffuser comprises a quartz disc (20) patterned with an array of holes or geometric shapes (21). Such discs are placed within the tubes defining the flow passages to substantially occlude the cylindrical passages in those tubes, save for the apertures within the discs. This is merely an example geometry. Although it will frequently be convenient to provide cylindrical tubular conduits with circular cross-sections, and consequently circular disc diffusers, other geometries might be considered without departing from the principles of the invention.

The disc diffuser may be placed in a vertical orientation within the crossmember, or in a horizontal orientation as part of the growth tube. In the embodiment a possible location for a vertical diffuser (9) and a possible location for a horizontal diffuser (11) are shown by way of illustrative example. In either case, the diffuser is placed downstream of the flow restrictor and acts to diffuse the directional flow from the flow restrictor. In particular, it is found that by selection of appropriate patterns of aperture, it may be possible to direct growth, and in particular defect growth, preferentially to one area of the grown material. Suitable patterns may be developed which direct defect growth preferentially towards the edge of the growing crystal, where it can most easily be discarded, and away from the centre of the growing crystal, where it may be more detrimental and/or harder to remove in subsequent fabrication, maximising the quality of the main part of the growing crystal.

In a convenient embodiment, a vertical diffuser in accordance with the example can be mounted or welded in place onto the quartz tube making up the crossmember. A horizontal diffuser may sit on a lip in the growth tube allowing it to be removed to access the boule.

Example designs of diffuser are shown in plan view in FIG. 2.

The invention claimed is:

1. A vapour conduit for use in an apparatus for bulk vapour phase crystal growth comprising:
 a flow conduit for transport of vapour from a source volume to a growth volume;

wherein a flow restrictor is provided in the flow conduit between the source volume and the growth volume, the flow restrictor comprising a formation that is structured to substantially occlude a flow passage of the flow conduit between a source zone and a growth zone and provide a single aperture of substantially reduced cross-section located generally on a longitudinal center line of the flow conduit so formed as to direct downstream flow in a longitudinal direction;

a flow director arranged in the flow conduit downstream of the flow restrictor and structured to direct vapour flow downstream of the flow restrictor away from a longitudinal centre line of the flow conduit; and wherein the flow director comprises a discrete diffuser formation downstream of the flow restrictor, and the diffuser comprises a planar formation extending across a cross-sectional area of the flow conduit so as to substantially occlude the flow conduit and provided with one or more apertured portions.

2. The vapour conduit in accordance with claim 1, wherein the flow director comprises a formation located within a flow path of the flow conduit being at least one of structured and positioned in the flow path such as to produce a modified downstream vapour flow so modified that peak vapour flow is directed away from a longitudinal centre line of the conduit.

3. The vapour conduit in accordance with claim 1, wherein the flow director comprises a formation structured to at least one of guide or direct vapour flow away from a longitudinal centre line of the conduit and restrict vapour flow along a longitudinal centre line of the conduit.

4. The vapour conduit in accordance with claim 1, wherein the flow director comprises an apertured formation structured to direct vapour flow downstream of the flow restrictor in a direction away from and at angle to a longitudinal direction of the flow conduit.

5. The vapour conduit in accordance with claim 1, wherein the flow director comprises an apertured formation located away from a longitudinal centre line of the flow conduit.

6. The vapour conduit in accordance with claim 1, wherein the flow director is integrally formed with the flow restrictor.

7. The vapour conduit in accordance with claim 6, wherein the flow restrictor comprises an apertured formation structured to direct vapour flow downstream in a direction away from and at angle to a longitudinal direction of the flow conduit.

8. The vapour conduit in accordance with claim 7, wherein the flow restrictor comprises a capillary transport tube directed away from a longitudinal direction of the flow conduit to direct vapour flow downstream of the flow restrictor in a direction away from and at angle to a longitudinal direction of the flow conduit.

9. The vapour conduit in accordance with claim 6, wherein the flow restrictor comprises an apertured formation located away from a longitudinal centre line of the flow conduit.

10. The vapour conduit in accordance with claim 9, wherein the flow restrictor comprises a capillary transport tube located off the longitudinal centre within the conduit.

11. The vapour conduit in accordance with claim 1, wherein the flow restrictor comprises a capillary transport tube.

12. The vapour conduit in accordance with claim 1, wherein the flow director comprises a further apertured formation downstream of the flow restrictor and structured to direct vapour flow in a direction away from and at angle to a longitudinal direction of the flow conduit.

13. The vapour conduit in accordance with claim 1, wherein the flow director comprises a further apertured formation downstream of the flow restrictor and located away from a longitudinal centre line of the flow conduit.

14. The vapour conduit in accordance with claim 1, wherein the diffuser comprises a planar formation patterned with an array of apertures in the form of circular or other geometric shapes, annular structures or annular segments or the like.

15. The vapour conduit in accordance with claim 1, wherein the diffuser is provided with one or more apertures which are not aligned in a longitudinal direction with the aperture or apertures defined by the flow restrictor.

16. The vapour conduit in accordance with claim 1, wherein the diffuser is provided with one or more apertures which are otherwise than at the longitudinal centre of the flow passage and with no such aperture(s) at the longitudinal centre of the flow passage.

17. An apparatus for bulk vapour phase crystal growth comprising:
a fluidly continuous envelope comprising at least one source volume;
at least one growth volume; and
at least one flow conduit between the source volume and the growth volume comprising a vapour conduit in accordance with claim 1.

18. The apparatus in accordance with claim 17, wherein each source volume includes at least one source zone in which a source is be provided for one or more of required elements or compounds for the growth of the crystal in a growth zone of the growth volume, and wherein a growth volume includes at least one growth zone in which the crystal may be grown during a growth phase in use.

19. The apparatus in accordance with claim 18, wherein each source zone and growth zone is with means for independent temperature control within the zone, the zones being thermally decoupled.

20. The apparatus in accordance with claim 18, wherein the fluidly continuous envelope defines a flow passage between each source zone and a growth zone and the or each flow passage so defined deviates from a straight line at at least two points between source and growth zones, for example deviating from a straight line at or about a junction between the source volume and the flow conduit and at or about a junction between the flow conduit and the growth volume.

21. The apparatus in accordance with claim 20, wherein the deviation from a straight line approaches 90 degrees, whereby the source volume, flow conduit and growth volume collectively define a U-shaped flow passage for vapour transport from a source zone to a growth zone in use.

22. The apparatus in accordance with claim 21, wherein an envelope volume defines a generally U-shaped tubular envelope having a source limb, a growth limb, and a crossmember connecting first and second limbs, and wherein the flow restrictor and flow director are provided in the crossmember.

23. A process for bulk vapour phase crystal growth comprising:
providing at least one reservoir of source material and at least one seed crystal, each associated with independent temperature control means;
transporting vapour phase material between source and sink or seed via a flow conduit with at least one flow restrictor provided in the flow conduit between a source volume and a growth volume, directing, via the at least one flow restrictor, so as to direct downstream flow in a longitudinal direction, the at least one flow restrictor comprising a formation that is structured to substantially occlude a flow passage of a conduit between a source zone and a growth zone and provide a single aperture of substantially reduced cross section located generally on a longitudinal center line of the conduit; and directing, via a diffuser, vapour flow in the flow conduit downstream of the flow restrictor away from a longitudinal centre line of the conduit and for example towards an edge of the flow conduit, the diffuser comprising a planar formation extending across a cross-sectional area of the flow conduit so as to substantially occlude the flow conduit, and provided with one or more aperture portions.

* * * * *